United States Patent [19]

Tobias

[11] 4,425,867

[45] Jan. 17, 1984

[54] APPARATUS FOR APPLYING TONER

[75] Inventor: Herbert A. Tobias, East Brunswick, N.J.

[73] Assignee: E. I. Du Pont de Nemours and Company, Wilmington, Del.

[21] Appl. No.: 64,396

[22] Filed: Aug. 6, 1979

[51] Int. Cl.³ .......................... B05C 1/02; B05C 19/00
[52] U.S. Cl. .................................... 118/120; 118/242; 118/656; 198/772; 198/755; 271/267
[58] Field of Search ...................... 118/120, 109, 242; 198/772, 755; 271/267

[56] References Cited

U.S. PATENT DOCUMENTS

| 1,827,640 | 10/1931 | Case ................................. 118/120 X |
| 3,667,590 | 6/1972 | Mead ............................... 198/771 X |
| 3,964,601 | 6/1976 | Armstrong ....................... 198/755 |
| 4,069,791 | 1/1978 | Tobias .............................. 118/120 |

Primary Examiner—John P. McIntosh

[57] ABSTRACT

An apparatus for applying toner to an imagewise tacky surface on a photo-element. The element advances through the apparatus between a pair of plates covered with pile fabrics. The pile fibers are slanted in the direction of advance. One of the plates carries a hopper filled with a particulate toner and one is reciprocated to impart movement to the element.

10 Claims, 5 Drawing Figures

APPARATUS FOR APPLYING TONER

DESCRIPTION

Technical Field

This invention relates generally to the development of latent images on photosensitive elements that have been exposed and, more particularly, to the application of toners to image-defining tacky surfaces.

BACKGROUND

Elements in sheet or web form with a photopolymerizable layer on one side are known and used widely in the graphic arts. Upon imagewise exposure, the surface of the photopolymerized layer has different degrees of tackiness in exposed and unexposed areas. That latent image is developed with toner particles. An apparatus requiring feed and withdrawal rolls for moving an exposed element beneath a hopper and through associated processing stations has been disclosed in U.S. Pat. No. 4,069,791.

DISCLOSURE OF INVENTION

Contact between the tacky surface on an imagewise exposed photo-element and feed or withdrawal rolls has been avoided with an apparatus which includes a pair of opposed plates between which the photo-element is advanced as toner particles are dispensed to and distributed over its tacky surface. The plate that faces the tacky surface is covered with a fabric having pile fibers slanted in the direction of advance for the element. A vibrator is attached to one of the plates for moving it to and fro in the path of advance.

DESCRIPTION OF DRAWINGS

Various embodiments of the apparatus have been illustrated in the accompanying drawings, wherein.

DESCRIPTION OF APPARATUS

Figure 1:
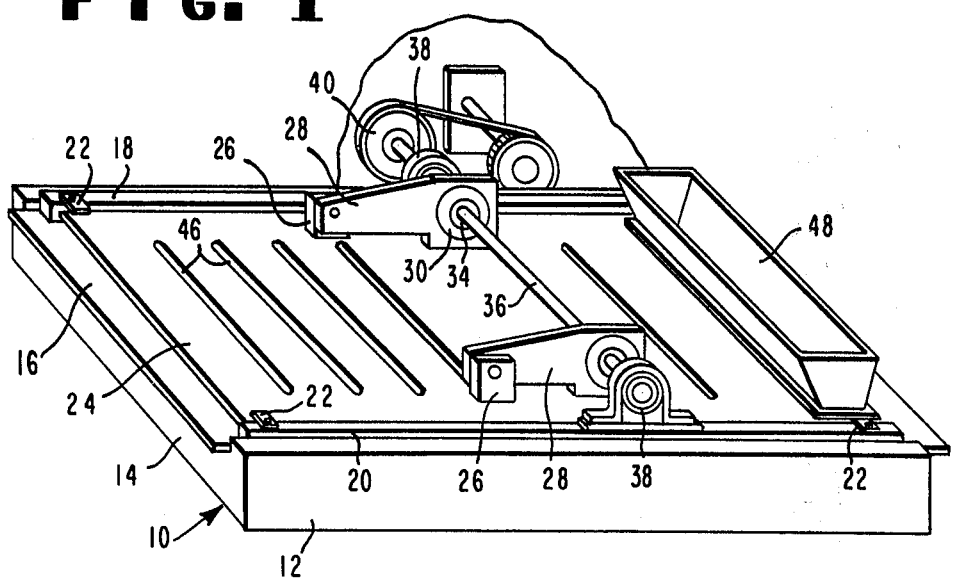
FIG. 1 is a perspective view.
Figure 2:
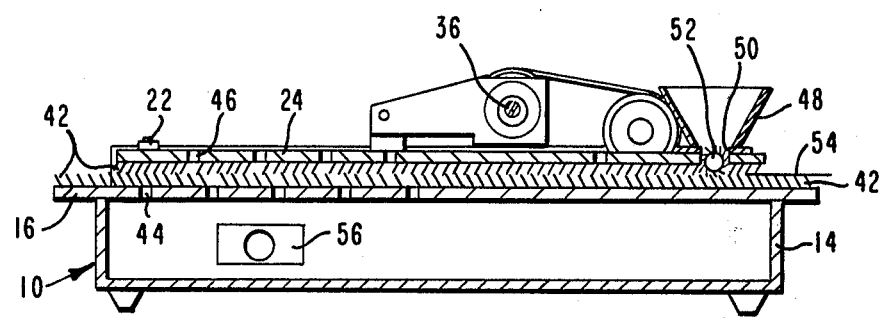
FIG. 2 is a longitudinal, sectional view.

The apparatus shown in FIGS. 1 and 2 includes a housing 10 having side walls 12 and end walls 14. End walls 14 are shorter than side walls 12, presenting ledges that receive a lower plate 16. Plate 16 is fastened to rails 18,20 which, in turn are fastened to side walls 12. The rails have pivoted tabs 22 for retaining an upper plate 24.

Plate 24 carries a pair of mounting blocks 26 for the pivoted ends of eccentric arms 28. Each arm 28 is bored adjacent its other end to receive a low friction ring 30 which, in turn, receives an eccentric 34 that is keyed to a drive shaft 36. Shaft 36 is mounted in bearings 38 and carries a pulley 40 that can be belt driven from a rotary power source.

Figure 3:
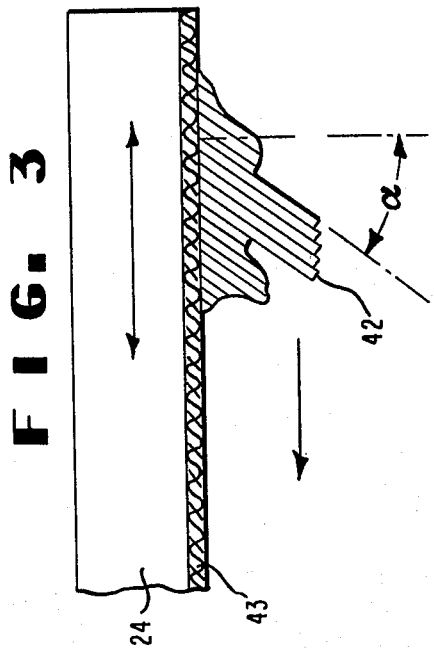
FIG. 3 is a fragmentary enlargement of the upper plate shown in FIGS. 1 and 2.

On their inner surfaces, plates 16 and 24 are covered with fabrics having pile fibers 42 oriented or slanted to the left in FIG. 2. The opposed plates and fabrics have series of transverse slots 44, 46. In FIG. 3, fibers 42 are shown projecting from a fabric backing 43 at a slant angle α.

A hopper 48 is attached to plate 24 above a slot 50. An applicator roll 52 covered with a fabric having shorter, oppositely oriented, pile fiber fits loosely in slot 50.

The apparatus is readied for operation by loading hopper 48 with particulate matter and coupling pulley 40 to a rotary source of power. Then, a discrete sheet 54 having a tacky surface is held in the position shown in FIG. 2, tacky surface up. As shaft 36 rotates, eccentrics 34 impart a vibratory motion to arms 28 and toner distribution plate 24 is reciprocated rapidly to and fro with respect to support plate 16. Relative movement between the opposed plates frees particulate matter lodged in the pile fibers 42 during a previous run and that matter is removed through slots 44 and an exhaust connection 56 in housing 10. The vibratory motion imparted by eccentric 34 and arms 28 and the oriented or slanted disposition of the fibers 42 advance sheet 54 beneath applicator roll 52. The opposite orientations of the pile fibers on plate 24 and roll 52 cause the roll to rotate and deposit the particulate matter uniformly. As sheet 54 advances through the apparatus, the fibers 42 in the fabric on plate 24 distribute the particles uniformly over the tacky surface and embed them.

If the fibers 42 in the fabrics adhered to plates 16, 24 are not oriented sufficiently, the sheet 54 will not "walk" through the apparatus. In this respect, mohair fabrics with pile fibers oriented at slant angles α of 30° and 50° from the vertical have been tested and found satisfactory. Slant angles α up to 80° are believed to be operable. Sheets having thicknesses ranging from 2 mils to ⅛ inch (0.3 cm) have been transported through an apparatus of the type shown in FIGS. 1 and 2. During operation of the apparatus, as one plate moves in the direction of advance, the pile fibers are compressed and wedge against and grip the sheet. This action advances the sheet. As the moving plate retracts, the fibers are placed in tension and the wedging, gripping action with respect to the sheet is released. With this reaction, slippage occurs between the plate and the sheet, i.e., the sheet does not move.

The apparatus is particularly useful in the toning of color proofs prepared from CROMALIN® photopolymer proofing film that is laminated to a receptor sheet prior to exposure. Exposure produces a surface that has a latent image with varying degrees of tackiness and, accordingly, has selective adhesion for the toner being applied. The apparatus is, of course, equally useful in the preparation of color display products and other discrete sheets having tacky surfaces to which dry, particulate materials are normally applied.

Figure 4:
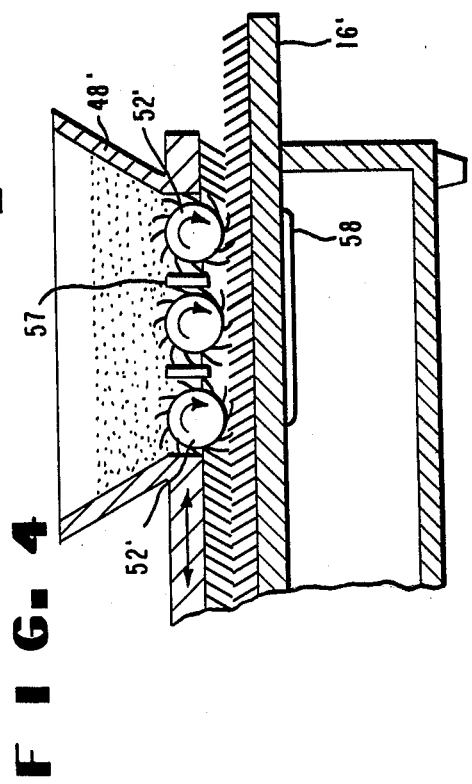
FIG. 4 shows a modification of the hopper.

The modification shown in FIG. 4 has a wider hopper 48' in the mouth of which three applicator rolls 52' are located. Between each pair of rolls 52', there is a divider 57. Beneath the hopper 48', on the lower surface of plate 16', there is a heater element 58. With plural rolls and the heater element, the density of the application on a tacky surface is increased. The construction and operation of this modification are otherwise the same as for the embodiment of FIGS. 1-3.

Figure 5:
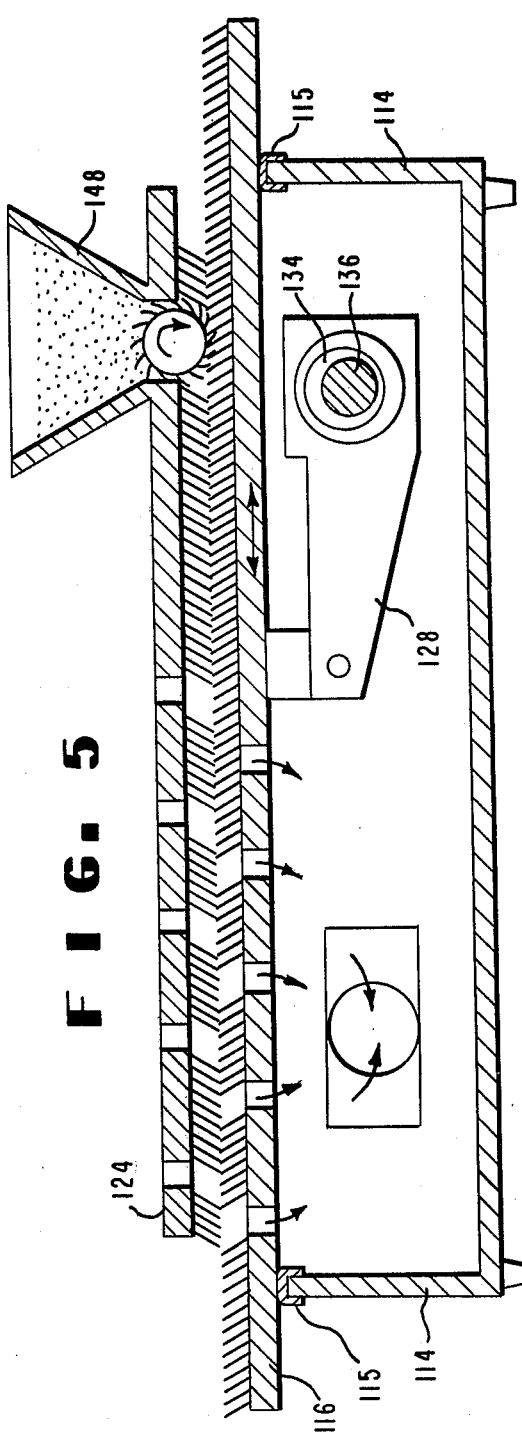
FIG. 5 is a longitudinal, sectional view of an alternate embodiment.

Another embodiment of the apparatus has been shown in FIG. 5. It has a stationary, upper plate 124 and movable lower plate 116. The vibrator attached to the lower surface of plate 116 includes eccentric arms 128 and eccentrics 134 keyed to a shaft 136. The tops of end walls 114 carry U-shaped slide bearings 115 that also seal the interior of housing 110. In operation, a sheet is placed on the fabric on reciprocating plate 116, tacky surface up, and advanced beneath hopper 148. As in the embodiment of FIGS. 1–3, the oriented fibers on the vibrated plate advance the sheet through the apparatus.

In the preferred embodiments described above, the distribution and support plates are both covered with fabrics. However, either embodiment is operable if the lower support plate is smooth and uncovered. Similarly, toner is dispensed adequately from the hopper if the applicator roll is either uncovered or covered with fibers oriented in the same direction as on distribution plate 24. These and other variations will occur to those skilled in the art without departing from the invention which accordingly is intended to be limited only by the scope of the appended claims.

I claim:

1. Apparatus for applying toner to an image defining tacky surface on a photo-element, the apparatus comprising:

a support plate;

a toner distribution plate disposed in parallelism with the support plate with one of the plates being reciprocally movable with respect to the other, the distribution plate and the support plate cooperating to define a photo-element conveying path therebetween, the distribution plate having a toner distribution slot therein, the support plate and the distribution plate each having pile fibers depending therefrom, the fibers slanting from their respective plates and converging toward the other plate in the direction of conveyance of the photo-element along the conveying path, a toner hopper adapted to receive a particulate toner therein mounted to the distribution plate and extending laterally thereacross, the hopper communicating with the toner distribution slot, an applicator mounted for rotation within the distribution slot, the applicator having bristles emanating therefrom, the bristles extending into the photo-element conveying path and slanting in a direction opposite to the direction of slant of the pile fibers; and, means attached to one of the plates for reciprocating it in a plane parallel to plane of the other plate, the relative motion between the plates and the fibers thereon imparting movement to the photo-element to convey it along the conveying path, the movement of the photo-element along the conveying path rotating the applicator to distribute toner from the hopper onto the photo-element.

2. Apparatus according to claim 1 wherein the pile fibers are oriented at slant angles of at least 30° with respect to the plate from which they depend.

3. Apparatus according to claims 1 or 2 wherein the applicator comprises a roller element mounted for rotation about an axis extending transversely of the distribution plate and within the distribution slot.

4. Apparatus according to claims 1 or 2 wherein the applicator comprises an array of roller elements each having bristles emanating therefrom and extending in the direction opposite to the direction of slant of the pile fibers, each of the rollers being mounted for rotation on axes extending transversely of the distribution plate and within the distribution slot, each of the axes of rotation being parallel to the other.

5. Apparatus according to claims 1 or 2 wherein the reciprocating means is attached to the distribution plate.

6. Apparatus according to claim 3 wherein the reciprocating means is attached to the distribution plate.

7. Apparatus according to claim 4 wherein the reciprocating means is attached to the distribution plate.

8. Apparatus according to claims 1 or 2 wherein the reciprocating means is attached to the support plate.

9. Apparatus according to claim 3 wherein the reciprocating means is attached to the support plate.

10. Apparatus according to claim 4 wherein the reciprocating means is attached to the support plate.

* * * * *